(12) United States Patent
Nam et al.

(10) Patent No.: US 11,035,905 B1
(45) Date of Patent: Jun. 15, 2021

(54) APPARATUS AND METHOD FOR TESTING PERFORMANCE OF BATTERY CELL

(71) Applicant: LG CHEM, LTD., Seoul (KR)

(72) Inventors: Gi-Min Nam, Daejeon (KR); Jin-Hyung Lim, Daejeon (KR); Du-Seong Yoon, Daejeon (KR); Won-Tae Joe, Daejeon (KR)

(73) Assignee: LG Chem, Ltd., Seoul (KR)

( * ) Notice: Subject to any disclaimer, the term of this patent is extended or adjusted under 35 U.S.C. 154(b) by 85 days.

(21) Appl. No.: 16/613,482

(22) PCT Filed: Jan. 8, 2019

(86) PCT No.: PCT/KR2019/000292
§ 371 (c)(1),
(2) Date: Nov. 14, 2019

(87) PCT Pub. No.: WO2019/139335
PCT Pub. Date: Jul. 18, 2019

(30) Foreign Application Priority Data

Jan. 9, 2018 (KR) .................. 10-2018-0002735

(51) Int. Cl.
*G01R 31/3842* (2019.01)
*G01R 31/389* (2019.01)

(52) U.S. Cl.
CPC ....... *G01R 31/389* (2019.01); *G01R 31/3842* (2019.01)

(58) Field of Classification Search
None
See application file for complete search history.

(56) References Cited

U.S. PATENT DOCUMENTS

| | | | |
|---|---|---|---|
| 8,624,560 | B2 | 1/2014 | Ungar et al. |
| 2012/0105069 | A1 | 5/2012 | Wang et al. |

(Continued)

FOREIGN PATENT DOCUMENTS

| | | |
|---|---|---|
| EP | 2 837 944 A1 | 2/2015 |
| JP | 2013-183509 A | 9/2013 |

(Continued)

OTHER PUBLICATIONS

International Search Report issued in corresponding International Patent Application No. PCT/KR2019/000292, dated Apr. 23, 2019.

(Continued)

*Primary Examiner* — Jas A Sanghera
(74) *Attorney, Agent, or Firm* — Morgan, Lewis & Bockius LLP

(57) ABSTRACT

Provided is an apparatus and method for testing the electrochemical performance of a battery cell in a non-destructive manner. The apparatus includes a measuring unit configured to measure an open circuit voltage (OCV) of the battery cell, a memory unit configured to store data obtained through pre-experiments for each of a plurality of reference cells and a process deviation value occurred in a manufacturing process of the battery cell, and a control unit electrically connected to the measuring unit and the memory unit. The control unit is configured to determine at least one of a capacity of the battery cell, an estimated profile data indicating a change in OCV of the battery cell in a predetermined state of charge (SOC) range and a resistance of the battery cell.

10 Claims, 15 Drawing Sheets

(56) References Cited

U.S. PATENT DOCUMENTS

| | | | |
|---|---|---|---|
| 2013/0317771 A1* | 11/2013 | Laskowsky | B60L 58/12 |
| | | | 702/63 |
| 2015/0066407 A1 | 3/2015 | Joe et al. | |
| 2016/0245872 A1 | 8/2016 | Rueger et al. | |
| 2017/0146610 A1 | 5/2017 | Cha et al. | |
| 2017/0205469 A1 | 7/2017 | Song et al. | |

FOREIGN PATENT DOCUMENTS

| | | |
|---|---|---|
| JP | 2015-59933 A | 3/2015 |
| JP | 2017-223454 A | 12/2017 |
| KR | 10-2010-0018178 A | 2/2010 |
| KR | 10-2013-0049920 A | 5/2013 |
| KR | 10-2013-0122543 A | 11/2013 |
| KR | 10-2015-0137583 A | 12/2015 |
| KR | 10-2016-0027241 A | 3/2016 |
| KR | 10-2016-0048585 A | 5/2016 |
| KR | 10-2017-0085365 A | 7/2017 |

OTHER PUBLICATIONS

Extended European Search Report dated Nov. 4, 2020, issued in corresponding European Patent Application No. 19738431.6.

* cited by examiner

APPARATUS AND METHOD FOR TESTING PERFORMANCE OF BATTERY CELL

TECHNICAL FIELD

The present disclosure relates to an apparatus and method for testing the performance of a battery cell, and more particularly, to an apparatus and method for testing the electrochemical performance of a battery cell in a non-destructive manner, taking process deviation occurred in the manufacturing process of the battery cell into account.

The present application claims priority to Korean Patent Application No. 10-2018-0002735 filed in the Republic of Korea on Jan. 9, 2018, the disclosure of which is incorporated herein by reference.

BACKGROUND ART

Recently, there is dramatically growing demand for portable electronic products such as laptop computers, video cameras and mobile phones, and with the extensive development of electric vehicles, accumulators for energy storage, robots and satellites, many studies are being made on high performance batteries that can be recharged repeatedly.

Currently, commercially available batteries include nickel-cadmium batteries, nickel-hydrogen batteries, nickel-zinc batteries, lithium secondary batteries and the like, and among them, lithium batteries have little or no memory effect, and thus they are gaining more attention than nickel-based batteries for their advantages of free charging and discharging, a very low self-discharge rate and high energy density.

A battery cell included in a battery basically includes a positive electrode, a negative electrode and an electrolyte. The charging and discharging of the battery cell is accomplished by movements of working ions (for example, lithium ions) involved in electrochemical reactions of the battery cell from the positive electrode to the negative electrode or from the negative electrode to the positive electrode.

The battery cell is manufactured through an activation process. In the activation process, the battery cell is charged and discharged in a predetermined number of cycles under a preset condition with a charging/discharging device being connected to the battery cell. When the conventional performance testing method is used, a maximum capacity value that can be actually extracted from the battery cell may be estimated based on a ratio of the charge capacity and the discharge capacity of the battery cell measured during the activation process. The maximum capacity value may be also called Full Charge Capacity (FCC).

However, through the conventional performance testing method, it is only possible to roughly know information about the usable range including the voltage window across two terminals of the battery cell, and it is impossible to know information about the usable range of each of the positive electrode and the negative electrode of the battery cell.

Additionally, some of lithium ions are irreversibly lost due to a solid electrolyte interface (SEI) generated by the reaction of lithium ions with carbon used in the negative electrode in the activation process, and thus the maximum capacity value of the battery cell is smaller than a preset design capacity value. However, the conventional performance testing method fails to provide information about the cause of a difference between the preset design capacity value and the maximum capacity value of the battery cell after the activation process.

To solve the above-described problem, a 3-electrode test method is disclosed. According to the 3-electrode test method, the usable range and the maximum capacity of each of the positive electrode and the negative electrode of the battery cell are measured by comparing the potential of each of the positive electrode and the negative electrode of the battery cell with the a potential of a reference electrode. However, to perform the 3-electrode test method, it is necessary to disassemble the battery cell including the positive electrode and the negative electrode and separately attach the reference electrode, which causes inconvenience. Further, the reference electrode may affect the electrochemical properties of the battery cell, and thus the measured results from the battery cell including the reference electrode may be inconsistent with the real electrochemical properties of the battery cell with no reference electrode.

Meanwhile, the electrochemical performance of the battery cell is affected by process deviations occurred in the manufacturing process of the battery cell. That is, process deviations of the electrode thickness, the electrode area or the electrode active material density occurred in the manufacturing process of the battery cell cause a deviation in the performance of the completed battery cell.

In general, the manufacturing process of the battery cell is divided into an electrode process and an assembly process. Specifically, the electrode process includes mixing, coating, roll press and slitting processes, and the assembly process includes vacuum drying, notching, lamination, folding and packaging processes. The process deviation occurring in each manufacturing process of the battery cell cause changes in values of amounts of positive electrode/negative electrode active materials per unit area and values of the total positive/negative electrode areas of the battery cell, and these process deviation values affect the performance of the completed battery cell.

To test the actual performance of the battery cell reflecting the process deviation, the conventional art manufactures a completed real battery cell and measures the capacity, the resistance and the usable range of the completed cell, or estimates the capacity of the completed cell through the design sheet.

However, the method that manufactures the completed battery cell and tests the performance is the most accurate method, but because it needs the activation process, lots of costs and time are required. Additionally, estimation through the design sheet is only enabled for the capacity of the battery cell, and it is impossible to estimate the resistance and the usable range (for example, open circuit voltage distribution as a function of the state of charge) of the battery cell.

DISCLOSURE

Technical Problem

The present disclosure is designed to solve the above-described problem, and therefore the present disclosure is directed to providing an apparatus and method for testing the performance of a battery cell without disassembling the battery cell to attach a reference electrode.

These and other objects and advantages of the present disclosure will be understood by the following description and will be apparent from the embodiments of the present disclosure. Further, it will be readily understood that the objects and advantages of the present disclosure can be realized by the means set forth in the appended claims and combinations thereof.

Technical Solution

An apparatus for testing performance of a battery cell according to an aspect of the present disclosure includes a measuring unit electrically connected to the battery cell and configured to measure an open circuit voltage (OCV) of the battery cell with a change in state of charge (SOC) of the battery cell, a memory unit configured to store a plurality of profile data indicating a change in OCV of a positive electrode or a negative electrode of each of a plurality of reference cells, a plurality of upper limits corresponding to an amount of lithium ions stored in the positive electrode or the negative electrode of each of the plurality of reference cells at an upper limit of a predetermined SOC range, a plurality of lower limits corresponding to an amount of lithium ions stored in the positive electrode or the negative electrode of each of the plurality of reference cells at a lower limit of the predetermined SOC range, and a process deviation value occurred in a manufacturing process of the battery cell, and a control unit electrically connected to the measuring unit and the memory unit. The control unit is configured to generate a plurality of reference profile data indicating a change in OCV of the plurality of reference cells in the predetermined SOC range based on the plurality of profile data, the plurality of upper limits and the plurality of lower limits. The control unit is configured to generate measured profile data indicating a change in OCV of the battery cell in the predetermined SOC range. The control unit is configured to determine at least one of a capacity of the battery cell, an estimated profile data indicating a change in OCV of the battery cell in the predetermined SOC range and a resistance of the battery cell based on the plurality of reference profile data, the measured profile data and the process deviation value.

The process deviation value may include at least one of a deviation value of an amount of positive electrode active materials per unit area, a deviation value of an amount of negative electrode active materials per unit area, a deviation value of a total positive electrode area, and a deviation value of a total negative electrode area, of the battery cell occurred in the manufacturing process of the battery cell.

The plurality of profile data may include positive electrode profile data and negative electrode profile data of each of the plurality of reference cells. The plurality of upper limits may include a reference positive electrode upper limit and a reference negative electrode upper limit of each of the plurality of reference cells. The plurality of lower limits may include a reference positive electrode lower limit and a reference negative electrode lower limit of each of the plurality of reference cells. The positive electrode profile data may indicate a change in OCV of the positive electrode of the reference cell with a change in an amount of lithium ions stored in the positive electrode of the reference cell. The negative electrode profile data may indicate a change in OCV of the negative electrode of the reference cell with a change in an amount of lithium ions stored in the negative electrode of the reference cell. The reference positive electrode upper limit may indicate an amount of lithium ions stored in the positive electrode of the reference cell at the upper limit of the predetermined SOC range. The reference negative electrode upper limit may indicate an amount of lithium ions stored in the negative electrode of the reference cell at the upper limit of the predetermined SOC range. The reference positive electrode lower limit may indicate an amount of lithium ions stored in the positive electrode of the reference cell at the lower limit of the predetermined SOC range. The reference negative electrode lower limit may indicate an amount of lithium ions stored in the negative electrode of the reference cell at the lower limit of the predetermined SOC range.

The control unit may be configured to determine an estimated positive electrode upper limit, an estimated positive electrode lower limit, an estimated negative electrode upper limit and an estimated negative electrode lower limit of the battery cell based on the plurality of reference profile data and the measured profile data. The estimated positive electrode upper limit may indicate an amount of lithium ions stored in the positive electrode of the battery cell at the upper limit of the predetermined SOC range. The estimated positive electrode lower limit may indicate an amount of lithium ions stored in the positive electrode of the battery cell at the lower limit of the predetermined SOC range. The estimated negative electrode upper limit may indicate an amount of lithium ions stored in the negative electrode of the battery cell at the upper limit of the predetermined SOC range. The estimated negative electrode lower limit may indicate an amount of lithium ions stored in the negative electrode of the battery cell at the lower limit of the predetermined SOC range.

The control unit may configured to declare a cost function indicating a sum of squares of residuals between the plurality of reference profile data and the measured profile data. The control unit may configured to estimate the estimated positive electrode upper limit, the estimated positive electrode lower limit, the estimated negative electrode upper limit, and the estimated negative electrode lower limit of the battery cell such that a value of the cost function is minimum.

The control unit may be configured to calculate a positive electrode irreversible capacity, a negative electrode irreversible capacity and a negative electrode side reaction capacity of the battery cell based on the plurality of profile data, the estimated positive electrode upper limit, the estimated positive electrode lower limit, the estimated negative electrode upper limit and the estimated negative electrode lower limit. The positive electrode irreversible capacity may indicate an unusable capacity of the positive electrode of the battery cell outside the predetermined SOC range. The negative electrode irreversible capacity may indicate an unusable capacity of the negative electrode of the battery cell outside the predetermined SOC range. The negative electrode side reaction capacity may indicate a side reaction capacity generated by a Solid Electrolyte Interface (SEI) film formed on a surface of the negative electrode of the battery cell.

The control unit may be configured to determine the capacity of the battery cell using a positive electrode reversible capacity corresponding to a capacity range from the estimated positive electrode lower limit to the estimated positive electrode upper limit, a negative electrode reversible capacity corresponding to a capacity range from the estimated negative electrode lower limit to the estimated negative electrode upper limit, and the capacity of the battery cell being equal.

The control unit may be configured to determine the capacity of the battery cell, the estimated profile data and the resistance of the battery cell based on the process deviation value and the negative electrode side reaction capacity.

The control unit may be configured to estimate the capacity of the battery cell by multiplying a capacity density constant corresponding to the negative electrode side reaction capacity by the process deviation value.

A method for testing performance of a battery cell according to another aspect of the present disclosure includes storing a plurality of profile data indicating a change in OCV of a positive electrode or a negative electrode of each of a plurality of reference cells, a plurality of upper limits corresponding to an amount of lithium ions stored in the positive electrode or the negative electrode of each of the plurality of reference cells at an upper limit of a predetermined SOC range, a plurality of lower limits corresponding to an amount of lithium ions stored in the positive electrode or the negative electrode of each of the plurality of reference cells at a lower limit of the predetermined SOC range, and a process deviation value occurred in a manufacturing process of the battery cell, generating a plurality of reference profile data indicating a change in OCV of each of the plurality of reference cells in the predetermined SOC range based on the plurality of profile data, the plurality of upper limits and the plurality of lower limits, measuring an OCV of the battery cell in the predetermined SOC range, generating measured profile data indicating a change in OCV of the battery cell in the predetermined SOC range, and determining at least one of a capacity of the battery cell, an estimated profile data indicating a change in OCV of the battery cell in the predetermined SOC range and a resistance of the battery cell based on the plurality of reference profile data, the measured profile data and the process deviation value.

Advantageous Effects

According to the present disclosure, it is possible to test the electrochemical performance of a test cell, taking process deviation occurred in the battery cell manufacturing process into account, without battery cell disassembly. Accordingly, it is possible to save the cost and time required to test the battery cell.

The present disclosure may have a variety of other effects, and these and other effects will be understood by the following description and will be apparent from the embodiments of the present disclosure.

BRIEF DESCRIPTION OF DRAWINGS

The accompanying drawings illustrate a preferred embodiment of the present disclosure, and together with the following detailed description of the present disclosure, serve to provide a further understanding of the technical aspects of the present disclosure, and thus the present disclosure should not be construed as limited to the drawings.

MODE FOR DISCLOSURE

Figure 1:
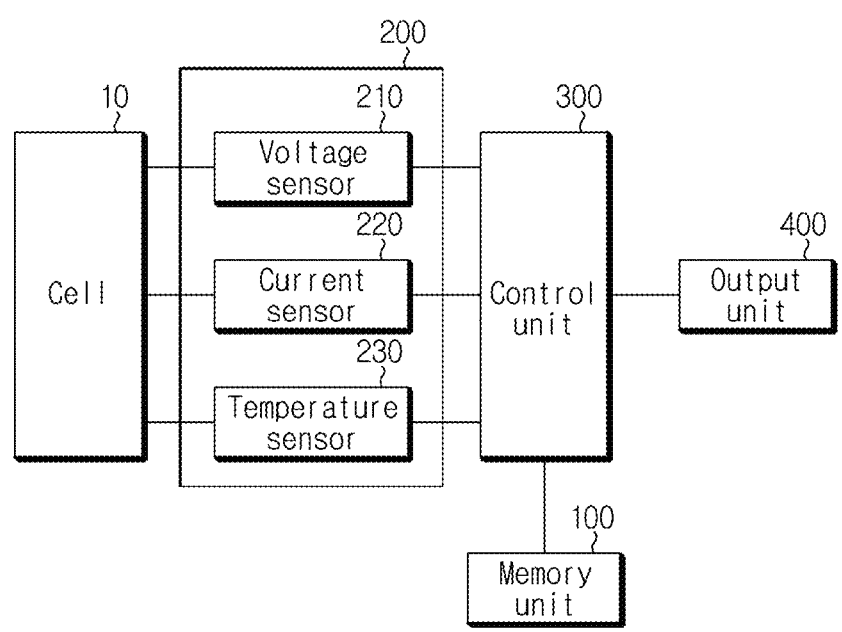
FIG. 1 is a schematic diagram showing the functional configuration of an apparatus for testing the performance of a battery cell according to an embodiment of the present disclosure.

Hereinafter, the preferred embodiments of the present disclosure will be described in detail with reference to the accompanying drawings. Prior to the description, it should be understood that the terms or words used in the specification and the appended claims should not be construed as limited to general and dictionary meanings, but interpreted based on the meanings and concepts corresponding to technical aspects of the present disclosure on the basis of the principle that the inventor is allowed to define terms appropriately for the best explanation.

Therefore, the embodiments described herein and illustrations shown in the drawings are just a most preferred embodiment of the present disclosure, but not intended to fully describe the technical aspects of the present disclosure, so it should be understood that a variety of other equivalents and variations could be made thereto at the time of filing the application.

Additionally, in describing the present disclosure, when it is deemed that a detailed description of relevant known elements or functions renders the key subject matter of the present disclosure ambiguous, the detailed description is omitted herein.

Unless the context clearly indicates otherwise, it will be understood that the term "comprises" or "includes" when used in this specification, specifies the presence of stated elements, but does not preclude the presence or addition of one or more other elements. Additionally, the term 'control unit' as used herein refers to a processing unit of at least one function or operation, and this may be implemented in hardware or software alone or in combination.

In addition, throughout the specification, it will be further understood that when an element is referred to as being "connected to" another element, it can be directly connected to the other element or intervening elements may be present.

In the specification, a battery cell has a negative electrode terminal and a positive electrode terminal, and it refers to a physically separable independent cell. For example, a pouch type lithium polymer cell may be regarded as the battery cell. Hereinafter, for convenience of description, the battery cell may be simply called a 'cell'. Additionally, a variety of voltage profiles as described below are not necessarily limited to those having a continuous shape, and may have a discrete shape.

FIG. 1 is a schematic diagram showing the functional configuration of an apparatus for testing the performance of a battery cell according to an embodiment of the present disclosure.

Referring to FIG. 1, the apparatus includes a measuring unit 200, a memory unit 100 and a control unit 300.

The measuring unit 200 is electrically connectable to the battery cell 10. The measuring unit 200 may be configured to measure an open circuit voltage (OCV) of the battery cell 10 with a change in state of charge (SOC) of the battery cell 10. Additionally, the measuring unit 200 may be electrically connected to the control unit 300, and transmit data measured from the battery cell 10 to the control unit 300. For example, as shown in FIG. 1, the measuring unit 200 may include at least one of a voltage sensor 210, a current sensor 220 and a temperature sensor 230. At least one of the voltage sensor 210, the current sensor 220 and the temperature sensor 230 may individually measure at least one of a voltage value, a current value and a temperature value of the battery cell 10 in response to a control signal provided from the control unit 300, and transmit a signal indicating the measured value to the control unit 300.

For example, the voltage sensor 210 may be implemented using a voltage measurement circuit commonly used in the art. Additionally, the current sensor 220 may be implemented using a hall sensor or a sense resistor commonly used in the art. Additionally, the temperature sensor 230 may be implemented using a thermocouple commonly used in the art.

The memory unit 100 may be configured to store reference information indicating the performance of each of a plurality of reference cells. Here, the reference information may be used as criteria of comparison for testing the performance of the battery cell 10.

Additionally, the reference information includes data obtained beforehand through pre-testing for each of the plurality of reference cells at Beginning Of Life (BOL). Here, the BOL may refer to the period of time from the time point at which the reference cell is initially manufactured to the time point at which the charge/discharge cycle of the reference cell reaches a predetermined number.

The reference information may include a plurality of profile data, a plurality of upper limits, a plurality of lower limits, and a process deviation value. Here, the plurality of profile data may be data indicating a change in OCV of the positive electrode or the negative electrode of each of the plurality of reference cells. Additionally, the plurality of upper limits may be a value corresponding to an amount of lithium ions stored in the positive electrode or the negative electrode of each of the plurality of reference cells at the upper limit of a predetermined SOC range. Additionally, the plurality of lower limits may be a value corresponding to an amount of lithium ions stored in the positive electrode or the negative electrode of each of the plurality of reference cells at the lower limit of the predetermined SOC range.

The process deviation value may be values occurred in the manufacturing process of the battery cell 10. The process deviation value may include at least one of a deviation value (for example, unit: $mg/cm^2$) of an amount of positive electrode active materials per unit area, a deviation value (for example, unit: $mg/cm^2$) of an amount of negative electrode active materials per unit area, a deviation value (for example, unit: $cm^2$) of a total positive electrode area, and a deviation value (for example, unit: $cm^2$) of a total negative electrode area, of the battery cell 10 occurred in the manufacturing process of the battery cell 10.

For example, the process deviation value may include a loading deviation value occurred in the coating process included in the electrode process in the manufacturing process of the battery cell 10, and a width deviation value and a length deviation value occurred in the notching process included in the assembly process in the manufacturing process of the battery cell 10.

The memory unit 100 may additionally store various data, instructions and software required for the overall operation of the apparatus. The memory unit 100 is not limited to a particular type, and may include any storage media capable of recording and erasing information.

For example, the memory unit 100 may be RAM, ROM, register, hard disk, an optical recording medium or a magnetic recording medium. Additionally, the memory unit 100 may be electrically connected to the control unit 300, for example, through a data bus, to allow the control unit 300 to access. Additionally, the memory unit 100 may store and/or update and/or erase and/or transmit programs including various control logics executed by the control unit 300 and/or data created when the control logics are executed. The memory unit 100 may be logically split into two or more.

The control unit 300 may be operably coupled to the measuring unit 200 and the memory unit 100, and exchange an electrical signal with the measuring unit 200 and the memory unit 100. The control unit 300 may receive the plurality of profile data, the plurality of upper limits and the plurality of lower limits from the measuring unit 200 and the memory unit 100.

The control unit 300 may generate a plurality of reference profile data indicating a change in OCV of each of the plurality of reference cells in the predetermined SOC range based on the plurality of profile data, the plurality of upper limits and the plurality of lower limits. Each reference profile data indicates a difference between positive electrode OCV profile and negative electrode OCV profile of each reference cell indicating profile data associated with each reference cell, i.e., OCV profile across two terminals of each reference cell.

Aside from the plurality of reference cells, the control unit 300 may generate measured profile data associated with the battery cell 10. Here, the battery cell 10 may be designed and manufactured with the same electrochemical properties as the plurality of reference cells. However, there may be a difference in the actual performance between the battery cell 10 and at least one of the reference cells, for example, due to a process deviation.

The control unit 300 may generate the measured profile data indicating a change in OCV across two terminals of the battery cell 10 in the predetermined SOC range measured by the measuring unit 200. In more detail, the control unit 300 may generate the measured profile data indicating the OCV profile across two terminals of the battery cell 10 in the predetermined SOC range based on voltage data of the battery cell 10 provided from the measuring unit 200. That is, the measured profile data indicates a change in OCV across two terminals of the battery cell 10 in the predetermined SOC range.

Additionally, the control unit 300 may be configured to test the electrochemical performance of the battery cell 10 in a nondestructive manner by referring to the data and instructions stored in the memory unit 100 or executing the software. That is, the control unit 300 may test the electrochemical performance of the battery cell 10 based on information obtained from the measuring unit 200 and the memory unit 100.

The control unit 300 may execute software for at least one of voltage value measurement, current value measurement, temperature value measurement, SOC estimation and state of health (SOH) estimation of the battery cell 10.

In detail, the control unit 300 may generate the plurality of reference profile data and the measured profile data based on information obtained from the measuring unit 200 and the memory. Additionally, the control unit 300 may determine at least one of the capacity of the battery cell 10, an estimated profile data indicating a change in OCV across two terminals of the battery cell 10 in the predetermined SOC range, and the resistance of the battery cell 10, based on the plurality of reference profile data, the measured profile data and the process deviation value.

The control unit 300 may be implemented such that it selectively includes a processor, an Application-Specific Integrated Circuit (ASIC), a chipset, a logic circuit, a register, a communication modem and/or a data processing device known in the art to perform the above-described operation.

The apparatus may further include an output unit 400. The output unit 400 outputs data processed by the control unit 300 in a recognizable form by a user. For example, the output unit 400 may include a display that outputs data processed by the control unit 300 in a visual form.

In another example, the output unit 400 may include a speaker that outputs data processed by the control unit 300 in an audible form. The user may receive the test result of the battery cell 10 through the output unit 400.

Hereinafter, assume that the positive electrode and the negative electrode of each reference cell and the battery cell 10 are $Li_x(NMC)O_2$ and $Li_yC_6$ respectively, and a working ion involved in electrochemical reactions causing the charge and discharge of each reference cell and the battery cell 10 is a lithium ion (Li+). Here, x is a stoichiometric value indicating an amount of lithium ions stored in the positive electrode, and y is a stoichiometric value indicating an amount of lithium ions stored in the negative electrode. For example, NMC may be a metal element such as Ni, Mn, Mg and Al.

Additionally, assume that the predetermined SOC range is between 0 and 1. The SOC of the cell being 1 indicates that the voltage across two terminals of the cell reaches a preset upper limit voltage and the cell is fully charged, and the SOC of the cell being 0 indicates that the voltage across two terminals of the cell reaches a preset lower limit voltage and the cell is fully discharged.

Figure 2:
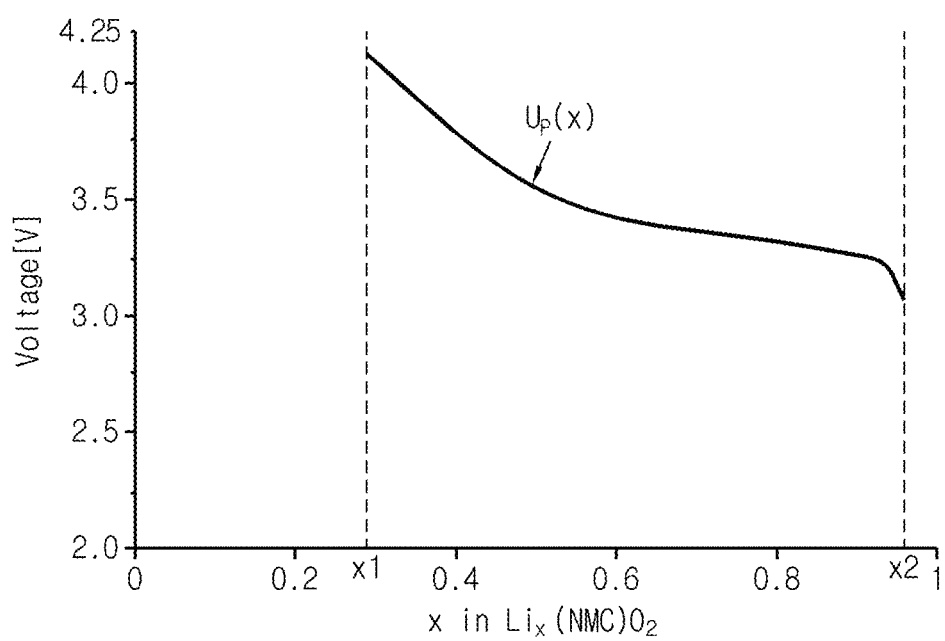
FIGS. 2 and 3 are exemplary diagrams showing a positive electrode open circuit voltage (OCV) profile of a specific reference cell for reference made by an apparatus for testing the performance of a battery cell according to an embodiment of the present disclosure.
Figure 3:
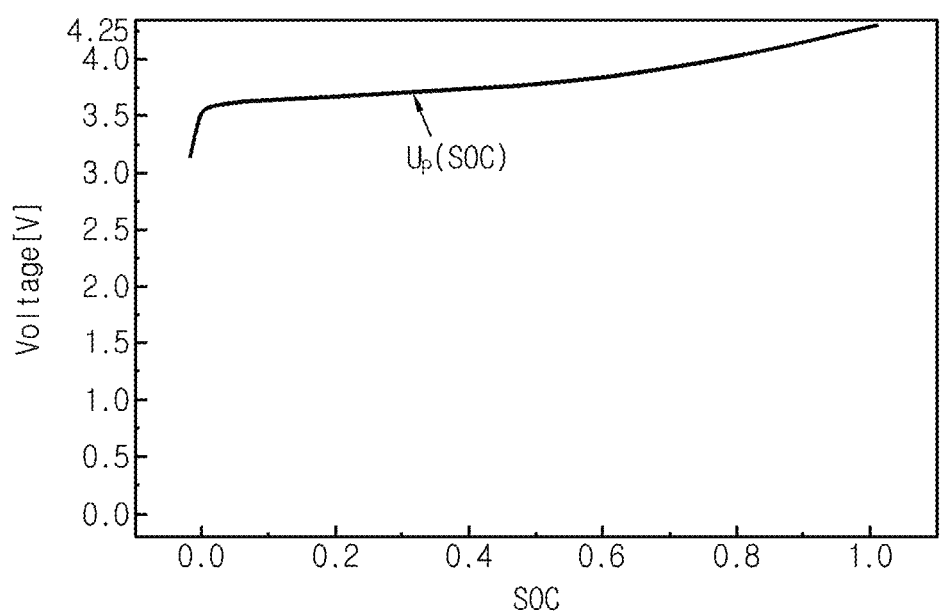

FIGS. 2 and 3 are exemplary diagrams showing a positive electrode OCV profile of a specific reference cell for reference made by the apparatus for testing the performance of a battery cell according to an embodiment of the present disclosure.

First, referring to FIG. 2, shown is the positive electrode OCV profile $U_p(x)$ of the reference cell measured while the amount x of lithium ions stored in the positive electrode ($Li_x(NMC)O_2$) of the reference cell is adjusted in the range between a first experimental value x1 and a second experimental value x2 through pre-experiment for the reference cell. Here, the positive electrode OCV of the reference cell is a difference between the positive electrode potential of the reference cell and the reference potential (for example, 0V).

According to the positive electrode OCV profile $U_p(x)$ of the reference cell shown in FIG. 2, as the amount x of lithium ions stored in the positive electrode of the reference cell increases from the first experimental value x1 toward the second experimental value x2, the positive electrode OCV of the reference cell gradually reduces. Here, the amount x of lithium ions may be determined from the following Equation 1.

$$x=P_i+(1-SOC)\times(P_f-P_i)$$ <Equation 1>

Here, x is the amount of lithium ions, $P_i$ is the reference positive electrode lower limit, $P_f$ is the reference positive electrode upper limit, and SOC is the SOC of the reference cell. In this instance, $P_f$ and $P_i$ are a predefined constant, and x is dependent on a change in SOC. That is, when one of x and SOC is known, the other will be known.

Referring to FIG. 3 together with FIG. 2, the control unit 300 may convert the positive electrode OCV profile $U_p(x)$ shown in FIG. 2 to positive electrode voltage profile $U_p(SOC)$ as a function of the SOC of the reference cell. That is, the control unit 300 may obtain $U_p(SOC)$ of FIG. 3 from the $U_p(x)$ of FIG. 2 using Equation 1. According to the positive electrode voltage profile $U_p(SOC)$ shown in FIG. 3, as the SOC increases from 0 toward 1, the positive electrode OCV of the reference cell gradually increases.

The plurality of profile data stored in the memory unit 100 may include positive electrode profile data of each of the plurality of reference cells.

In detail, the positive electrode profile data indicates a change in OCV of the positive electrode of the reference cell with a change in the amount of lithium ions stored in the positive electrode of the reference cell. That is, the positive electrode profile data may be the positive electrode OCV profile ($U_p(x)$). For example, as the charging cycle of the reference cell increases, the amount of lithium ions stored in the positive electrode of the reference cell gradually reduces, while the potential of the positive electrode of the reference cell gradually increases.

The plurality of upper limits stored in the memory unit 100 may include a plurality of reference positive electrode upper limits.

In detail, the reference positive electrode upper limit corresponds to an amount of lithium ions stored in the positive electrode of the reference cell at the upper limit of the predetermined SOC range. In more detail, the reference positive electrode upper limit refers to a stoichiometric value indicating, in the range between 0 and 1, a value obtained by subtracting the first experimental value indicating an amount of working ions stored in the positive electrode of the reference cell at the time point at which the SOC of the reference cell reaches the upper limit of the predetermined SOC range from a first threshold on the basis of the first threshold, where the first threshold indicates a maximum amount of working ions (for example, lithium ions) that can be stored in the positive electrode of the reference cell. For example, if the amount of working ions stored in the positive electrode of the reference cell when the SOC of the reference cell reaches the upper limit of the predetermined SOC range is 10% of the first threshold, the reference positive electrode upper limit is (100%−10%)/100%=0.90.

The plurality of lower limits stored in the memory unit 100 may include a plurality of reference positive electrode lower limits.

In detail, the reference positive electrode lower limit corresponds to an amount of lithium ions stored in the positive electrode of the reference cell at the lower limit of the predetermined SOC range. In more detail, the reference positive electrode lower limit refers to a stoichiometric value indicating, in the range between 0 and 1, a value obtained by subtracting the second experimental value indicating an amount of working ions stored in the positive electrode of the reference cell at the time point at which the SOC of the reference cell reaches the lower limit of the predetermined SOC range from the first threshold on the basis of the first threshold. For example, if the amount of working ions stored in the positive electrode of the reference cell when the SOC of the reference cell reaches the lower limit of the predetermined SOC range is 80% of the first threshold, the reference positive electrode lower limit is (100%−80%)/100%=0.20.

As the SOC of the reference cell reduces, the amount of working ions stored in the positive electrode of the reference cell increases. Accordingly, the reference positive electrode lower limit is lower than the reference positive electrode upper limit.

Figure 4:
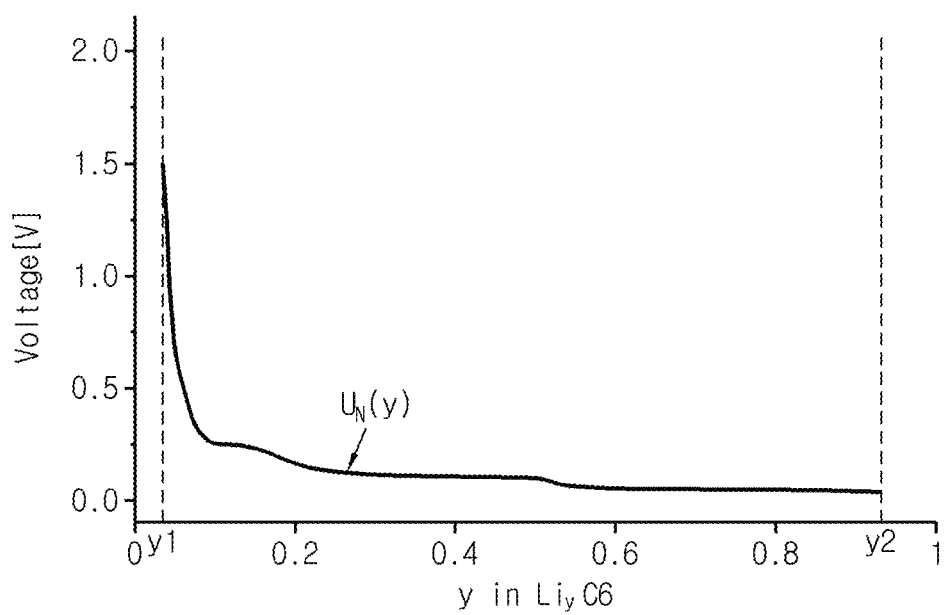
FIGS. 4 and 5 are exemplary diagrams showing a negative electrode OCV profile of a specific reference cell for reference made by an apparatus for testing the performance of a battery cell according to an embodiment of the present disclosure.
Figure 5:
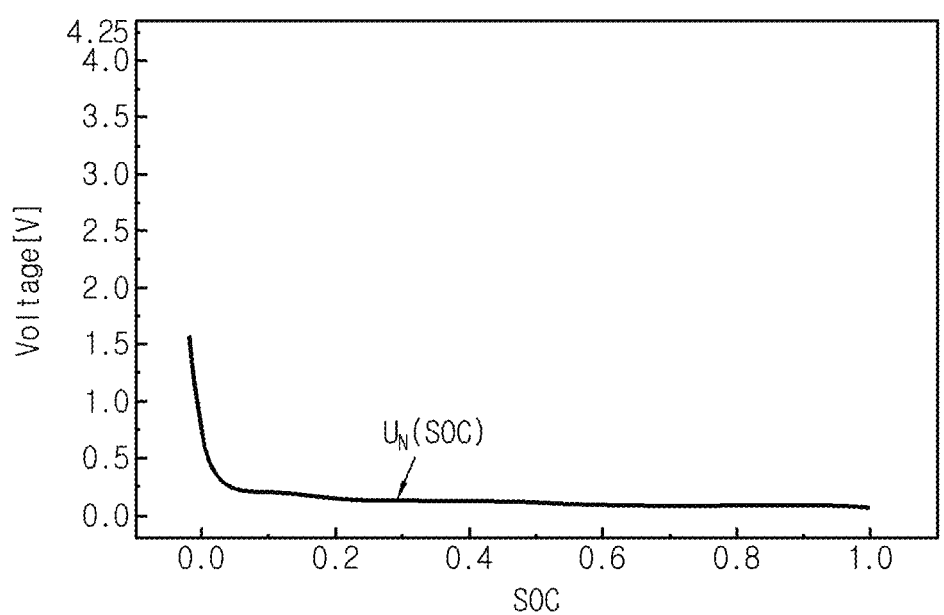

FIGS. 4 and 5 are exemplary diagrams showing a negative electrode OCV profile of the specific reference cell for reference made by the apparatus for testing the performance of a battery cell according to an embodiment of the present disclosure.

First, referring to FIG. 4, shown is the negative electrode OCV profile $U_N(y)$ of the reference cell measured while the amount y of lithium ions stored in the negative electrode ($Li_yC_6$) of the reference cell is adjusted in the range between a third experimental value y1 and a fourth experimental value y2 through pre-experiment for the reference cell. The negative electrode OCV of the reference cell is a difference between the negative electrode potential of the reference cell and the reference potential (for example, 0V).

According to the negative electrode OCV profile $U_N(y)$ of the reference cell shown in FIG. 4, as the amount y of lithium ions stored in the negative electrode of the reference cell increases from the third experimental value y1 toward the fourth experimental value y2, the negative electrode OCV of the reference cell gradually reduces. Here, the amount y of lithium ions may be determined from the following Equation 2.

$$y=N_i+SOC\times(N_f-N_i)$$ <Equation 2>

Here, y is the amount of lithium ions, $N_i$ is the reference negative electrode lower limit, $N_f$ is the reference negative electrode upper limit, and SOC is the SOC of the reference cell. In this instance, $N_f$ and $N_i$ are a predefined constant, and y is dependent on a change in SOC. That is, when one of y and SOC is known, the other will be known.

Referring to FIG. 5 together with FIG. 4, the control unit 300 may convert the negative electrode OCV profile $U_N(y)$ to negative electrode voltage profile $U_N(SOC)$ as a function of the SOC of the reference cell. That is, the control unit 300 may obtain $U_N(SOC)$ of FIG. 5 from the $U_N(y)$ of FIG. 4 using the above Equation 2. According to the negative electrode voltage profile $U_N(SOC)$ as a function of the SOC of the reference cell shown in FIG. 5, as the SOC increases from 0 toward 1, the negative electrode OCV of the reference cell gradually reduces.

The plurality of profile data stored in the memory unit 100 may include negative electrode profile data of each of the plurality of reference cells.

In detail, the negative electrode profile data indicates a change in OCV of the negative electrode of the reference cell with a change in the amount of lithium ions stored in the negative electrode of the reference cell. That is, the negative electrode profile data may be the negative electrode OCV profile $U_N(y)$). For example, as the charging cycle of the reference cell increases, the amount of lithium ions stored in the negative electrode of the reference cell gradually increases, while the potential of the negative electrode of the reference cell gradually reduces.

The plurality of upper limits stored in the memory unit 100 may include reference negative electrode upper limits of each of the plurality of reference cells.

Additionally, the reference negative electrode upper limit corresponds to an amount of lithium ions stored in the negative electrode of the reference cell at the upper limit of the predetermined SOC range. In more detail, the reference negative electrode upper limit refers to a stoichiometric value indicating, in the range between 0 and 1, the third experimental value indicating an amount of working ions stored in the negative electrode of the reference cell at the time point at which the SOC of the reference cell reaches the upper limit of the predetermined SOC range on the basis of a second threshold indicating a maximum amount of working ions (for example, lithium ions) that can be stored in the negative electrode of the reference cell. For example, if the amount of working ions stored in the negative electrode of the reference cell when the SOC of the reference cell reaches the upper limit of the predetermined SOC range is 95% of the second threshold, the reference negative electrode upper limit is 95%/100%=0.95.

The plurality of lower limits stored in the memory unit 100 may include reference negative electrode lower limits of each of the plurality of reference cells.

The reference negative electrode lower limit corresponds to an amount of lithium ions stored in the negative electrode of the reference cell at the lower limit of the predetermined SOC range. In more detail, the reference negative electrode lower limit refers to a stoichiometric value indicating, in the range between 0 and 1, the fourth experimental value indicating an amount of working ions stored in the negative electrode of the reference cell at the time point at which the SOC of the reference cell reaches the lower limit of the predetermined SOC range on the basis of the second threshold. For example, if the amount of working ions stored in the negative electrode of the reference cell when the SOC of the reference cell reaches the lower limit of the predetermined SOC range is 5% of the second threshold, the reference negative electrode lower limit is 5%/100%=0.05.

As the SOC of the reference cell reduces, the amount of working ions stored in the negative electrode of the reference cell reduces. Accordingly, the reference negative electrode lower limit is lower than the reference negative electrode upper limit.

Figure 6:
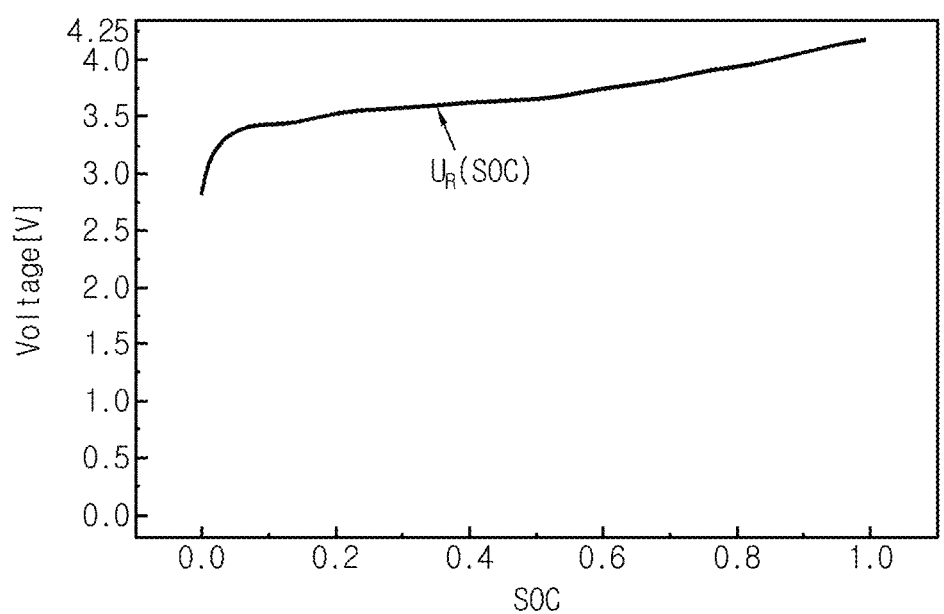
FIG. 6 is an exemplary diagram showing a two-terminal OCV profile of a specific reference cell for reference made by an apparatus for testing the performance of a battery cell according to an embodiment of the present disclosure.

FIG. 6 is an exemplary diagram showing a two-terminal OCV profile of the specific reference cell for reference made by the apparatus for testing the performance of a battery cell according to an embodiment of the present disclosure.

Referring to FIG. 6, the two-terminal OCV profile UR(SOC) as a function of the SOC of the reference cell is shown. Here, UR(SOC) may be obtained from a difference between the positive electrode voltage profile $U_P(SOC)$ shown in FIG. 3 and the negative electrode voltage profile $U_N(SOC)$ shown in FIG. 5 in the SOC range between 0 and 1.

As described above, the positive electrode voltage profile $U_P(SOC)$ is associated with the positive electrode profile data, the reference positive electrode upper limit and the reference positive electrode lower limit, and the negative electrode voltage profile $U_N(SOC)$ is associated with the negative electrode profile data, the reference negative electrode upper limit and the reference negative electrode lower limit. Accordingly, the control unit 300 may generate the reference profile data indicating the two-terminal OCV profile UR(SOC) of the specific reference cell based on the positive electrode profile data, the negative electrode profile data, the reference positive electrode upper limit, the reference positive electrode lower limit, the reference negative electrode upper limit and the reference negative electrode lower limit.

Figure 7:
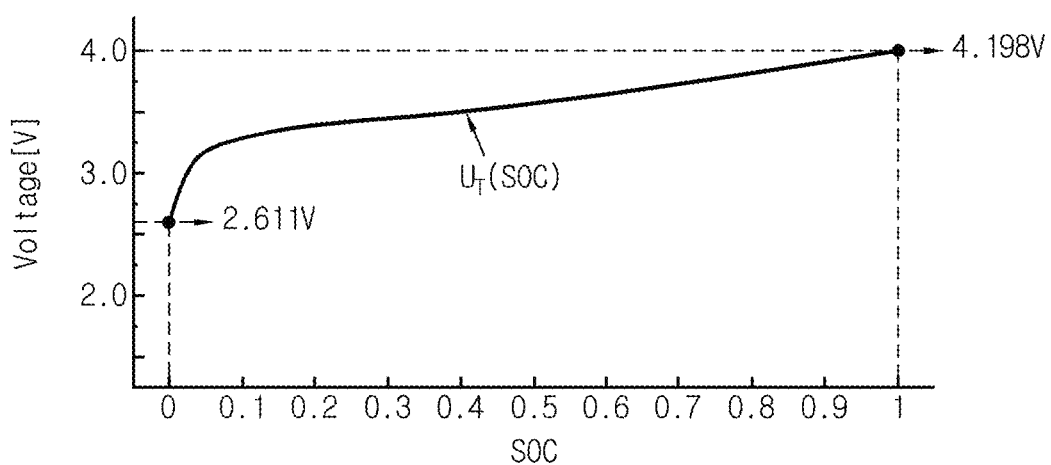
FIG. 7 is an exemplary diagram showing a two-terminal OCV profile of a battery cell.

FIG. 7 is an exemplary diagram showing a two-terminal OCV profile of the battery cell.

Referring to FIG. 7, the two-terminal OCV profile $U_T(SOC)$ as a function of the SOC of the battery cell 10 is shown. Here, $U_T(SOC)$ indicates a change in OCV across two terminals of the battery cell 10 measured by the measuring unit 200 with changing SOC of the battery cell 10 in the predetermined SOC range (for example, 0-1).

As described above, the control unit 300 may generate the measured profile data based on the measured voltage value provided from the measuring unit 200.

For example, in $U_T(SOC)$ shown in FIG. 7, the OCV of the battery cell 10 measured by the measuring unit 200 at the SOC of the battery cell 10 of 0 is 2.611V, and the OCV of the battery cell 10 measured by the measuring unit 200 at the SOC of the battery cell 10 of 1 is 4.198V.

The apparatus is an apparatus that estimates the electrochemical performance of the completed cell changing due to the process deviation occurred in the manufacturing process of the battery cell 10. For convenience of estimation, under the assumption that the lower limit 2.611V and the upper limit 4.198V of OCV across two terminals of the battery cell 10 are fixed, while a SOC-OCV curve associated with the battery cell 10 changes due to the process deviation, the apparatus estimates the SOC-OCV curve of the battery cell 10, i.e., OCV profile across two terminals as a function of SOC.

Figure 8:
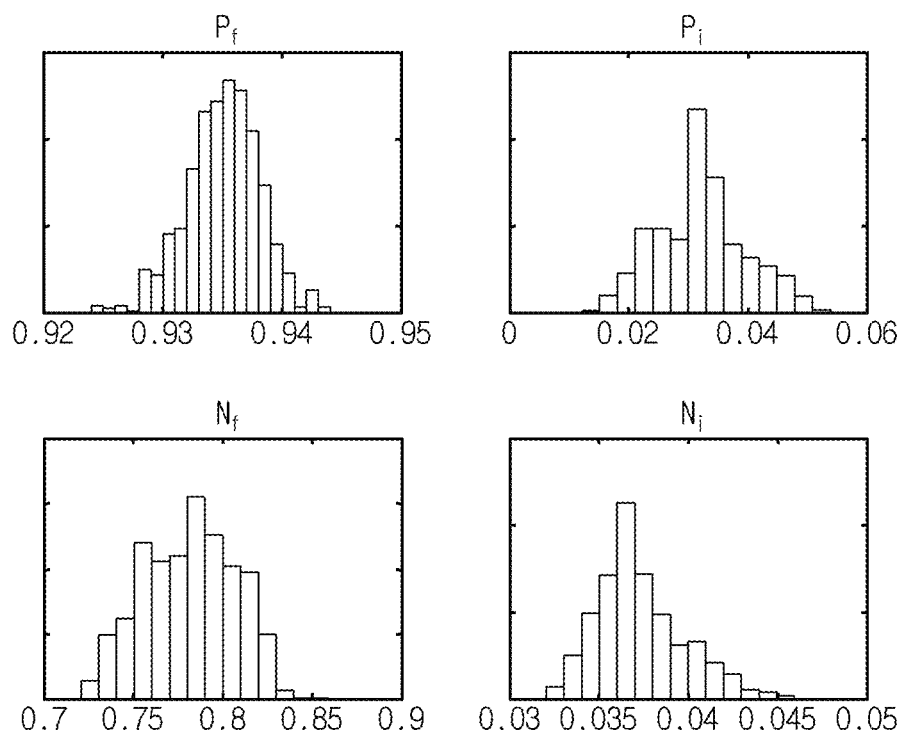
FIGS. 8 and 9 are diagrams for reference in describing an operation of estimating the usable range of a battery cell 10 by an apparatus for testing the performance of the battery cell according to an embodiment of the present disclosure.
Figure 9:
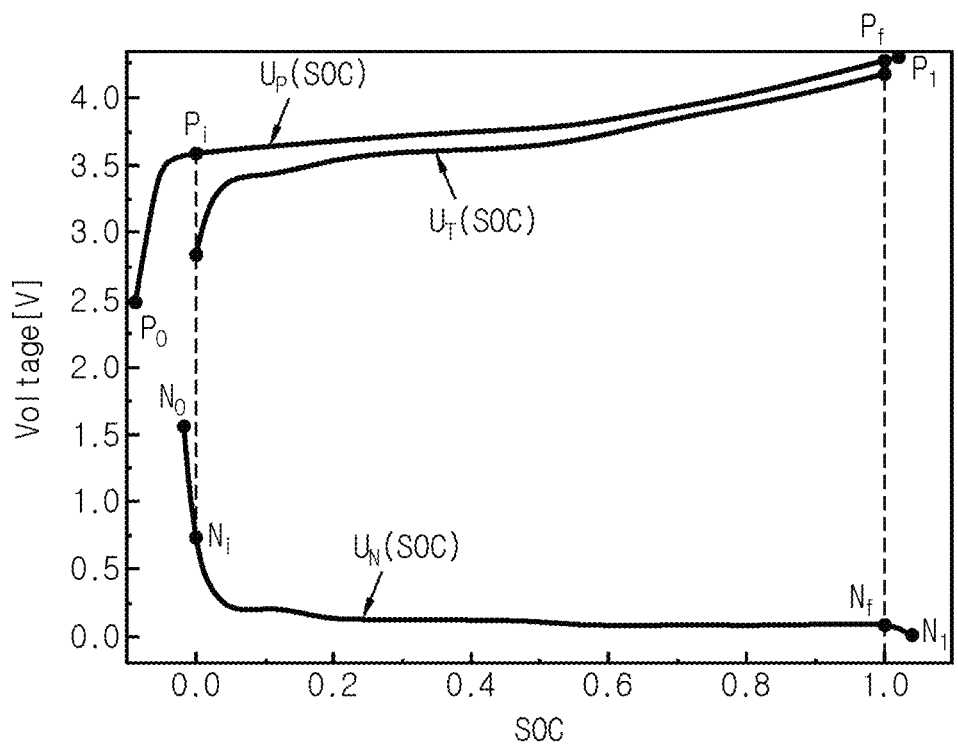

FIGS. 8 and 9 are diagrams for reference in describing an operation in which the apparatus for testing the performance of a battery cell according to an embodiment of the present disclosure estimates the usable range of the battery cell 10.

Referring to FIGS. 8 and 9, the control unit 300 may estimate an estimated positive electrode upper limit $P_f$, an estimated positive electrode lower limit $P_i$, an estimated negative electrode upper limit $N_f$, and an estimated negative electrode lower limit $N_i$ of the battery cell 10. In detail, when the generation of the measured profile data is completed, the control unit 300 may determine the estimated positive electrode upper limit, the estimated positive electrode lower limit, the estimated negative electrode upper limit and the estimated negative electrode lower limit of the battery cell 10 based on the plurality of reference profile data and the measured profile data.

Here, the estimated positive electrode upper limit indicates an estimated amount of working ions stored in the positive electrode of the battery cell 10 when the SOC of the battery cell 10 is equal to the upper limit of the predetermined SOC range. In detail, the estimated positive electrode upper limit refers to a stoichiometric value indicating, in the range between 0 and 1, a value obtained by subtracting a first estimated value indicating an estimated amount of working ions stored in the positive electrode of the battery cell 10 at the time point at which the SOC of the battery cell 10 reaches the upper limit of the predetermined SOC range from the first threshold on the basis of the first threshold. For example, if the first estimated value is 5% of the first threshold, the estimated positive electrode upper limit is (100%−5%)/100%=0.95.

The estimated positive electrode lower limit indicates an estimated amount of working ions stored in the positive electrode of the battery cell 10 when the SOC of the battery cell 10 is equal to the lower limit of the predetermined SOC range. In detail, the estimated positive electrode lower limit refers to a stoichiometric value indicating, in the range between 0 and 1, a value obtained by subtracting a second estimated value indicating an estimated amount of working ions stored in the positive electrode of the battery cell 10 at the time point at which the SOC of the battery cell 10 reaches the lower limit of the predetermined SOC range from the first threshold on the basis of the first threshold. For example, if the second estimated value is 95% of the first threshold, the estimated positive electrode lower limit is (100%−95%)/100%=0.05. Here, as the SOC of the battery cell 10 reduces, the amount of working ions stored in the positive electrode of the battery cell 10 increases, and thus the estimated positive electrode lower limit is lower than the estimated positive electrode upper limit.

The estimated negative electrode upper limit indicates an estimated amount of working ions stored in the negative electrode of the battery cell 10 when the SOC of the battery cell 10 is equal to the upper limit of the predetermined SOC range. In detail, the estimated negative electrode upper limit refers to a stoichiometric value indicating, in the range between 0 and 1, a third estimated value indicating an estimated amount of working ions stored in the negative electrode of the battery cell 10 at the time point at which the SOC of the battery cell 10 reaches the upper limit of the predetermined SOC range on the basis of the second threshold. For example, if the amount of working ions stored in the negative electrode of the battery cell 10 when the SOC of the battery cell 10 reaches the upper limit of the predetermined SOC range is 90% of the second threshold, the estimated negative electrode upper limit is 90%/100%=0.90.

The estimated negative electrode lower limit indicates an estimated amount of working ions stored in the negative electrode of the battery cell 10 when the SOC of the battery cell 10 is equal to the lower limit of the predetermined SOC range. In detail, the estimated negative electrode lower limit refers to a stoichiometric value indicating, in the range between 0 and 1, a fourth estimated value indicating an estimated amount of working ions stored in the negative electrode of the battery cell at the time point at which the SOC of the battery cell 10 reaches the lower limit of the predetermined SOC range on the basis of the second threshold. For example, if the amount of working ions stored in the negative electrode of the battery cell 10 when the SOC of the battery cell 10 reaches the lower limit of the predetermined SOC range is 10% of the second threshold, the estimated negative electrode lower limit is 10%/100%=0.10. Here, as the SOC of the battery cell 10 reduces, the amount of working ions stored in the negative electrode of the battery cell 10 reduces, and thus the estimated negative electrode lower limit is lower than the estimated negative electrode upper limit.

The control unit 300 may declare a cost function indicating the sum of the squares of residuals between the two-terminal OCV profile $U_T(SOC)$ shown in FIG. 7 and the two-terminal OCV profile $U_R(SOC, \theta)$ shown in FIG. 6. n sample values obtained from each of the measured profile data and the plurality of reference profile data are used as input values of the cost function. The cost function may be expressed as the following Equation 3.

$$S(\theta)=\Sigma_{i=1}^{n}|U_T(SOC_i)-U_R(SOC_i,\theta)|^2 \qquad \text{<Equation 3>}$$

Here, the $SOC_i$ is any one of the sample values, and the $S(\theta)$ is the cost function. Assume that when an arbitrary $\theta$ is given, $U_R(SOC, \theta)$ and $U_T(SOC)$ perfectly match. In this case, obviously, an output value of the cost function is 0, and the control unit 300 may calculate that the usable range of the battery cell 10 is equal to $\theta$. In this respect, the control unit 300 may estimate the parameters indicating the usable range of the battery cell 10 such that the value of the cost function is minimum through a preset probability model. In this instance, the usable range of the battery cell 10 represents the performance of the battery cell 10.

The following algorithms may be used to estimate the usable range of the battery cell 10 from the cost function.

1) Gradient based optimization algorithm: fmincon, fminsearch

2) Global optimization algorithm: simulated annealing, genetic algorithm

3) Markov Chain Monte Carlo (MCMC) algorithm: Metropolis-Hastings, Gibbs Sampling Of course, it should be understood that optimization algorithms other than the above-listed algorithms or Bayesian estimation scheme may be used to estimate the usable range of the battery cell 10.

Referring to FIG. 8, histograms showing the posterior distributions for each of four parameters $P_f$, $P_i$, $N_f$, $N_i$ related to the usable range of the battery cell 10 calculated from the cost function using the probability model are shown. In each histogram, the horizontal axis denotes a value of the parameter, and the vertical axis denotes probability.

For example, the control unit 300 may estimate that specific parameter values conforming to a preset rule (for example, having a largest probability value) are the estimated positive electrode upper limit, the estimated positive electrode lower limit, the estimated negative electrode upper limit and the estimated negative electrode lower limit of the battery cell 10 from each posterior distribution.

Referring to FIG. 9, the control unit 300 may determine the estimated positive electrode upper limit $P_f$, the estimated positive electrode lower limit $P_i$, the estimated negative electrode upper limit $N_f$ and the estimated negative electrode lower limit $N_i$ of the battery cell 10 satisfying the lower limit 2.611V and the upper limit 4.198V of OCV across two terminals of the battery cell 10.

In detail, the control unit 300 may determine points of $U_T(SOC)$, $U_T(SOC)$ and $U_N(SOC)$ from $U_P(SOC)$ shown in FIG. 3, $U_N(SOC)$ shown in FIG. 5 and $U_T(SOC)$ shown in FIG. 7 at SOC 0 on a vertical axis as the estimated positive electrode lower limit $P_i$ and the estimated negative electrode lower limit $N_i$. Additionally, the control unit 300 may estimate points of $U_P(SOC)$, $U_T(SOC)$ and $U_N(SOC)$ at SOC 1 on a vertical axis as the estimated positive electrode upper limit $P_f$ and the estimated negative electrode upper limit $N_f$. For example, a voltage difference between OCV at the point of the estimated positive electrode lower limit $P_i$ and OCV at the point of the estimated negative electrode lower limit Ni may be 2.611V. Additionally, a voltage difference between OCV at the point of the estimated positive electrode upper limit $P_f$ and OCV at the point of the estimated negative electrode upper limit $N_f$ may be 4.198V.

For reference, in the graph of FIG. 9, $P_0$ indicates the OCV of the point at which the SOC of the positive electrode is 0, and $P_1$ indicates the OCV of the point at which the SOC of the positive electrode is 1. Additionally, $N_0$ indicates the OCV of the point at which the SOC of the negative electrode is 0, and $N_1$ indicates the OCV of the point at which the SOC of the negative electrode is 1.

Figure 10:
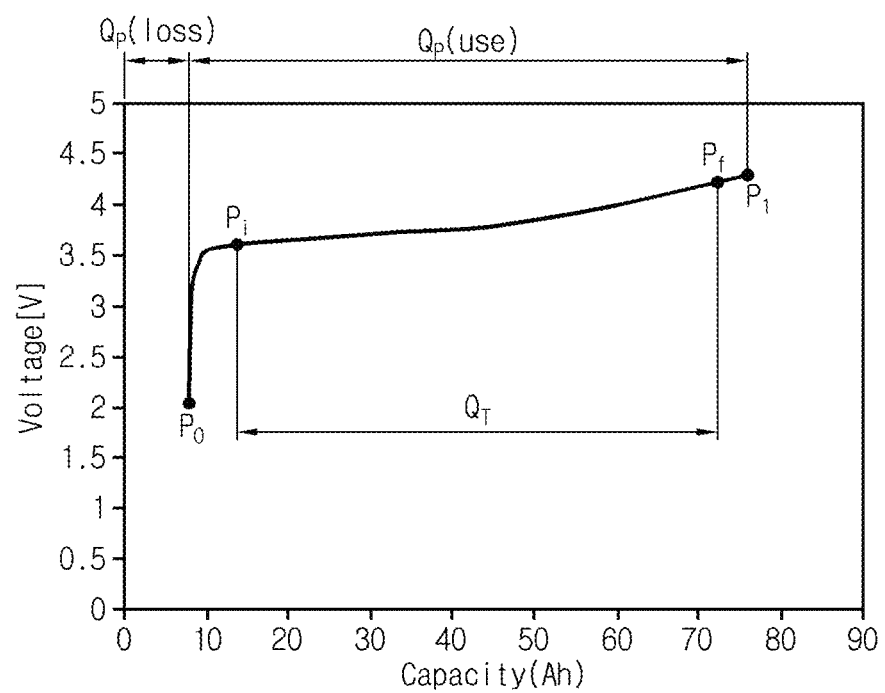
FIGS. 10 and 11 are diagrams for reference in describing an operation in which an apparatus for testing the performance of a battery cell according to an embodiment of the present disclosure estimates the capacity of the battery cell.
Figure 11:
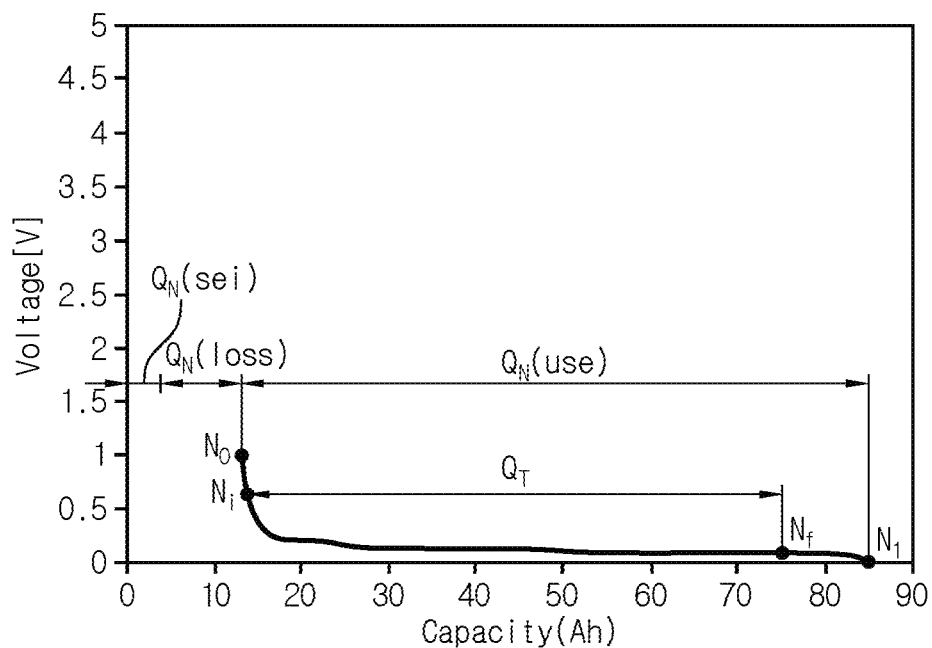

FIGS. 10 and 11 are diagrams for reference in describing an operation of estimating the capacity of the battery cell by the apparatus for testing the performance of a battery cell according to an embodiment of the present disclosure.

Referring to FIG. 10, a relationship between a positive electrode irreversible capacity $Q_P(loss)$, a positive electrode reversible capacity $Q_P(use)$ and a capacity($Q_T$) of the battery cell 10 is shown. Additionally, referring to FIG. 11, a relationship between a negative electrode side reaction capacity $Q_N(sei)$, a negative electrode irreversible capacity $Q_N(loss)$, a negative electrode reversible capacity $Q_N(use)$ and a capacity($Q_T$) of the battery cell 10 is shown.

The control unit 300 may estimate the positive electrode irreversible capacity, the negative electrode irreversible capacity, and the negative electrode side reaction capacity of the battery cell 10 based on the plurality of profile data, and the estimated positive electrode upper limit, the estimated positive electrode lower limit, the estimated negative electrode upper limit, and the estimated negative electrode lower limit of the battery cell 10.

Here, the positive electrode reversible capacity indicates a usable capacity of the positive electrode of the battery cell 10 in the predetermined SOC range. The negative electrode reversible capacity indicates a usable capacity of the negative electrode of the battery cell 10 in the predetermined SOC range. The positive electrode irreversible capacity indicates an unusable capacity of the positive electrode of the battery cell 10 outside the predetermined SOC range. The negative electrode irreversible capacity indicates an unusable capacity of the negative electrode of the battery cell 10 outside the predetermined SOC range. Additionally, the negative electrode side reaction capacity indicates a side reaction capacity of the negative electrode generated by the Solid Electrolyte Interface (SEI) film formed on the negative electrode surface of the battery cell 10.

In detail, the control unit 300 may estimate the capacity of the battery cell 10 based on the positive electrode profile data of each of the plurality of reference cells, the negative electrode profile data of each of the plurality of reference cells, the estimated positive electrode upper limit, the estimated positive electrode lower limit, the estimated negative electrode upper limit and the estimated negative electrode lower limit.

The control unit 300 may estimate the capacity of the battery cell 10 using the positive electrode reversible capacity corresponding to the capacity range from the estimated positive electrode lower limit to the estimated positive electrode upper limit, the negative electrode reversible capacity corresponding to the capacity range from the estimated negative electrode lower limit to the estimated negative electrode upper limit, and the capacity of the battery cell 10 being equal.

In more detail, the control unit 300 may estimate the capacity of the battery cell using the following Equations 4 and 5.

$$Q_T = Q_P(P_f) - Q_P(P_i) \qquad \text{<Equation 4>}$$

Here, $Q_T$ denotes the capacity of the battery cell 10, $Q_P$ denotes the positive electrode reversible capacity, $P_f$ denotes the estimated positive electrode upper limit, and $P_i$ denotes the estimated positive electrode lower limit.

$$Q_T = Q_N(N_f) - Q_N(N_i) \qquad \text{<Equation 5>}$$

Here, $Q_T$ denotes the capacity of the battery cell, $Q_N$ denotes the negative electrode reversible capacity, $N_f$ denotes the estimated negative electrode upper limit, and $N_i$ denotes the estimated negative electrode lower limit.

The control unit 300 may estimate the capacity of the battery cell 10 from the positive electrode reversible capacity and the negative electrode reversible capacity obtained from the positive electrode profile data and the negative electrode profile data based on the estimated positive electrode upper limit, the estimated positive electrode lower limit, the estimated negative electrode upper limit and the estimated negative electrode lower limit.

The control unit 300 may calculate the irreversible capacity of the battery cell 10 in the predetermined SOC range using the following Equation 6.

$$Q(\text{loss}) = Q_P \times P_i - Q_N \times N_i \qquad \text{<Equation 6>}$$

Here, Q(loss) is the irreversible capacity of the battery cell 10. ($Q_P \times P_i$) denotes the positive electrode irreversible capacity of the battery cell 10. ($Q_N \times N_i$) denotes the negative electrode irreversible capacity of the battery cell 10.

The control unit 300 may calculate the negative electrode side reaction capacity of the battery cell 10 using the following Equation 7.

$$Q_P(\text{loss}) + Q_P \times P_i = Q_N(\text{loss}) + Q_N(\text{sei}) + Q_N \times N_i \qquad \text{<Equation 7>}$$

Here, $Q_P(\text{loss})$ denotes the positive electrode irreversible capacity of the battery cell 10, $Q_p$ denotes the positive electrode reversible capacity, and $P_i$ denotes the estimated positive electrode lower limit. Additionally, $Q_N(\text{loss})$ denotes the negative electrode irreversible capacity of the battery cell 10, $Q_N(\text{sei})$ denotes the negative electrode side reaction capacity of the battery cell, $Q_N$ denotes the negative electrode reversible capacity, and $N_i$ denotes the estimated negative electrode lower limit.

The control unit 300 may calculate the irreversible capacity of the battery cell 10 using the above Equation 6 based on the positive electrode irreversible capacity and the negative electrode irreversible capacity obtained from the positive electrode profile data and the negative electrode profile data.

The control unit 300 may estimate the capacity of the battery cell 10, the estimated profile data, and the resistance of the battery cell 10 based on the process deviation value and the negative electrode side reaction capacity. In detail, the control unit 300 may estimate the estimated positive electrode upper limit, the estimated positive electrode lower limit, the estimated negative electrode upper limit and the estimated negative electrode lower limit reflecting the process deviation value, and based on this, may estimate the capacity of the battery cell 10, the estimated profile data, and the resistance of the battery cell 10.

The control unit 300 may calculate a capacity density constant of the battery cell 10 using the following Equation 8.

$$Q_S = \frac{Q_N(\text{sei})}{R_{loading} \times R_{width} \times R_{length}} \qquad \langle\text{Equation 8}\rangle$$

Here, $Q_S$ is the capacity density constant. The unit of the capacity density constant may be indicated in capacity per unit mass. For example, the unit of the capacity density constant may be mAh/g. Additionally, $Q_N(\text{sei})$ denotes the negative electrode side reaction capacity of the battery cell 10, $R_{loading}$ denotes a value (for example, unit: mg/cm$^2$) of the amount of negative electrode active materials per unit area in the reference cell, and $R_{width} \times R_{length}$ denotes a value of the total negative electrode area (for example, unit: cm$^2$) of the reference cell. Here, $R_{loading}$ and $R_{width} \times R_{length}$ may be pre-stored in the memory unit 100.

The capacity density constant of the battery cell 10 is a value that is proportional to a value of the negative electrode side reaction capacity of the battery cell 10. That is, the capacity density constant of the battery cell 10 corresponds to the value of the negative electrode side reaction capacity of the battery cell 10.

The control unit 300 may estimate the capacity of the battery cell 10 by multiplying the capacity density constant corresponding to the negative electrode side reaction capacity by the process deviation value.

The control unit 300 may calculate the capacity of the battery cell 10 by multiplying the capacity density constant by the process deviation value using the following Equation 9.

$$Q_T = Q_S \times T_{loading} \times T_{width} \times T_{length} \qquad \text{<Equation 9>}$$

Here, $Q_T$ denotes the capacity of the battery cell 10, $Q_S$ denotes the capacity density constant of the battery cell 10, and $T_{loading}$ denotes a value (for example, unit: mg/cm$^2$) of the amount of positive electrode active materials or negative electrode active materials per unit area of the battery cell 10. $T_{width} \times T_{length}$ denotes a value (for example, unit: cm$^2$) of the total area of the positive electrode or the negative electrode of the battery cell 10. $T_{width}$ denotes a value (for example, unit: cm) of the width of the positive electrode or the negative electrode of the battery cell 10. $T_{length}$ denotes a value (for example, unit: cm) of the length of the positive electrode or the negative electrode of the battery cell 10. The above-described calculated results may be provided to the user through the output unit. Here, $T_{loading}$ and $T_{width} \times T_{length}$ may be pre-stored in the memory unit 100.

The control unit 300 may calculate the capacity of the battery cell 10 reflecting the process deviation value, the estimated profile data indicating a change in two-terminal OCV of the battery cell 10 and the resistance of the battery cell 10 using the above Equation 9. Here, the $T_{loading}$, the $T_{width}$ and the $T_{length}$ may be a value reflecting the process deviation value occurred in the manufacturing process of the battery cell 10. In detail, $T_{loading}$ may reflect the deviation value of the amount of positive active materials or negative electrode active materials per unit area in the battery cell 10. $T_{width}$ may reflect the deviation value of the width of the positive electrode or the negative electrode of the battery cell 10. $T_{length}$ may reflect the deviation value of the length of the positive electrode or the negative electrode of the battery cell 10.

In detail, the control unit 300 may estimate the positive electrode reversible capacity, the positive electrode irreversible capacity, the estimated positive electrode upper limit and the estimated positive electrode lower limit of the battery cell 10 reflecting the process deviation value based on the value of the amount of positive electrode active materials per unit area in the battery cell 10 and the total positive electrode area of the battery cell 10.

The control unit 300 may determine the negative electrode reversible capacity, the negative electrode irreversible capacity, the estimated negative electrode upper limit and the estimated negative electrode lower limit of the battery cell 10 reflecting the process deviation value based on the value of the amount of negative electrode active materials per unit area in the battery cell 10 and the total negative electrode area of the battery cell 10.

The control unit 300 may estimate the capacity of the battery cell 10 and the estimated profile data indicating a change in OCV across two terminals of the battery cell 10 in the predetermined SOC range based on the estimated results.

The control unit 300 may estimate the resistance of the battery cell 10 based on the estimated results. For example, the resistance of the battery cell 10 may be calculated using a change in OCV over time obtained through the discharge experiment of the battery cell 10 conducted for 10 sec from the OCV when the SOC of the battery cell 10 is 0.5. In this case, the resistance of the battery cell 10 reflecting the process deviation value may be estimated using the OCV reflecting the process deviation value and a SOC-OCV table.

The control unit 300 may use the above-described estimation scheme and simulation scheme (for example, SIMBA battery simulation) and the above-described equations in the process of estimating the capacity of the battery cell 10, the estimated profile data of the battery cell 10 and the resistance of the battery cell 10.

The above-described apparatus for testing the performance of the battery cell 10 may test the deviation of the capacity of the battery cell 10 resulting from the process deviation occurred in the manufacturing process of the battery cell 10. Additionally, the apparatus may test the deviation of the SOC-OCV profile of the battery cell 10 resulting from the process deviation. Additionally, the apparatus may test the deviation of the resistance of the battery cell 10 resulting from the process deviation.

Figure 12:
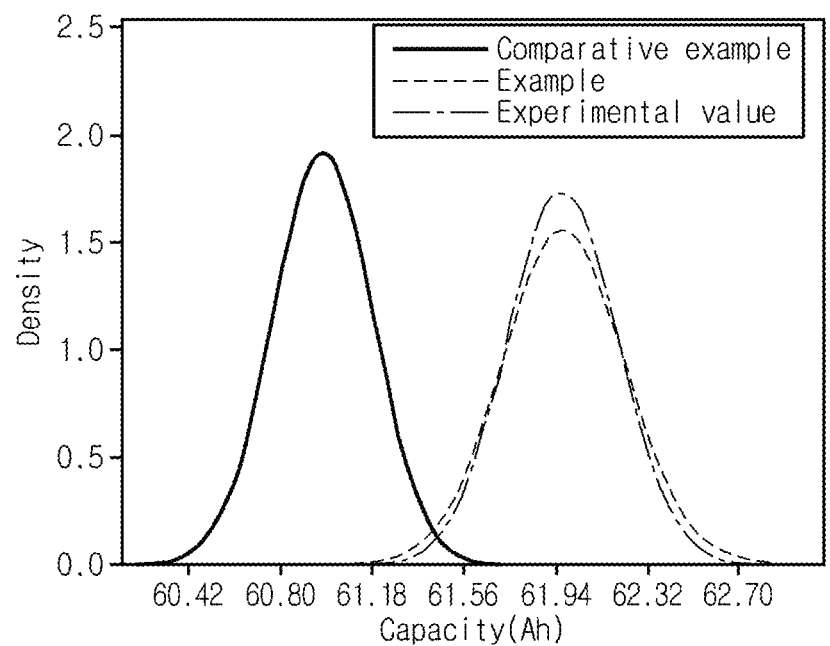
FIGS. 12 to 14 show the results of comparison between the performance of a battery cell estimated by an apparatus according to an embodiment of the present disclosure and the actual performance of the battery cell.
Figure 13:
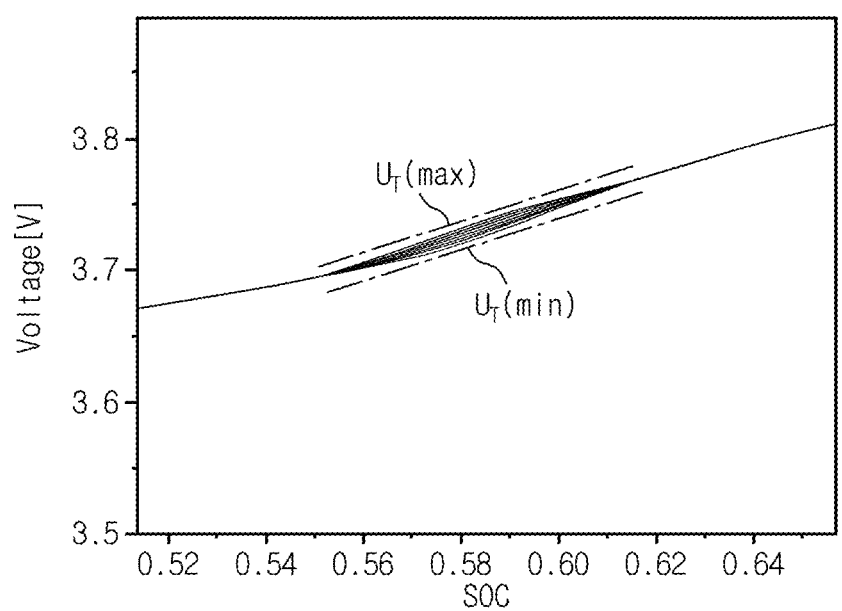
Figure 14:
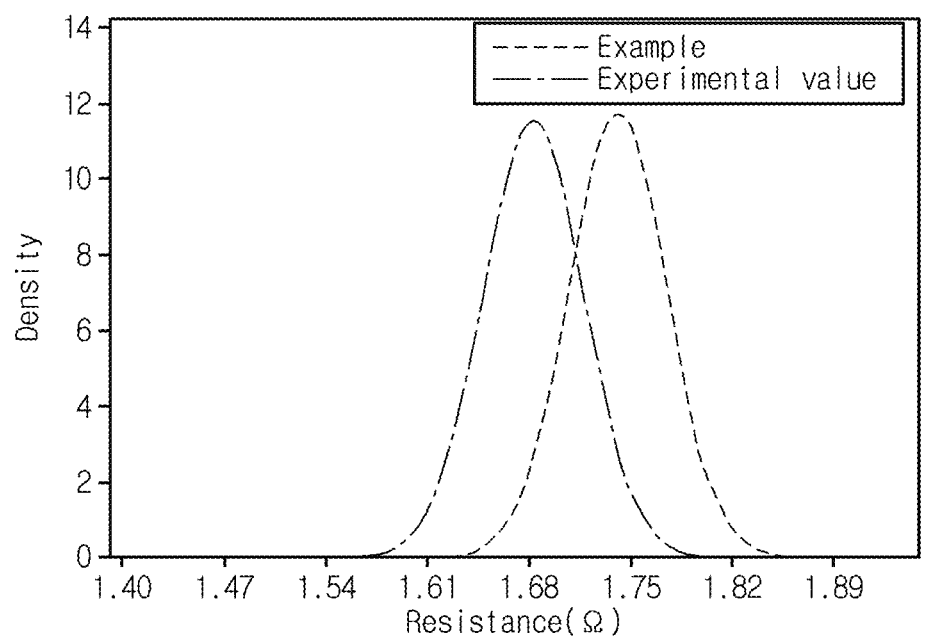

FIGS. 12 to 14 show the results of comparison between the performance of the battery cell estimated by the apparatus according to an embodiment of the present disclosure and the actual performance of the battery cell.

First, referring to FIG. 12, normal distribution curves of a comparative example, an example, and an experimental value relating to the capacity of the battery cell 10 are shown. The comparative example is a normal distribution curve showing the capacity of the battery cell 10 as conventionally estimated using the design sheet. The example is a normal distribution curve showing the capacity of the battery cell 10 estimated by the apparatus. The experimental value is a normal distribution curve showing the measured value of the actual capacity of the battery cell 10. As shown in FIG. 12, the normal distribution curve of the example is closer to the normal distribution curve of the experimental value than the comparative example.

That is, the comparison results shown in FIG. 12 support that when the apparatus is used, it is possible to obtain capacity test results corresponding to the actual performance of the battery cell 10 well without disassembling the battery cell 10.

Referring to FIG. 13, the SOC-OCV curve of the battery cell 10 according to an embodiment of the present disclosure, i.e., the estimated profile data indicating a change in OCV across two terminal of the battery cell 10 in the predetermined SOC range is shown. For convenience of description, FIG. 13 shows the SOC-OCV curves of the plurality of battery cells 10 estimated in the range between SOC 0.52 and SOC 0.64.

The apparatus may estimate different SOC-OCV curves for each battery cell 10 by reflecting the process deviation value occurred in the manufacturing process of the battery cell 10. In contrast, in the case of the comparative example using the design sheet, only one SOC-OCV curve may be estimated.

The graph of FIG. 13 shows the SOC-OCV curves of the plurality of battery cells 10 estimated in the range between the maximum value $U_T(max)$ of the SOC-OCV curve of the battery cell 10 and the minimum value $U_T(min)$ of the SOC-OCV curve of the battery cell 10. Here, the experimental value indicating the actually measured SOC-OCV curve of the battery cell 10 is distributed between $U_T(max)$ and $U_T(min)$.

As shown in FIG. 13, the distribution of the SOC-OCV curve of the example may estimate the SOC-OCV curve of the experimental value more accurately than the comparative example. Additionally, an accurate SOC-OCV curve reflecting the process deviation may be estimated. Through this, the apparatus may estimate a SOC-OCV curve close to the real experimental value, and provide the accurate SOC-OCV curve to Battery Management System (BMS).

That is, the comparison results shown in FIG. 13 support that when the apparatus is used, it is possible to obtain SOC-OCV curve test results corresponding to the actual performance of the battery cell 10 well without disassembling the battery cell 10.

Referring to FIG. 14, normal distribution curves of the example and the experimental value relating to the resistance of the battery cell 10 are shown. The example is a normal distribution curve showing the resistance of the battery cell 10 estimated by the apparatus. The experimental value is a normal distribution curve showing the measured value of the actual resistance of the battery cell 10. FIG. 14 shows that the normal distribution curve of the example is close to the normal distribution curve of the experimental value. In contrast, the conventional method for testing the performance of a battery cell using the design sheet cannot estimate the resistance of the battery cell 10.

That is, the comparison results shown in FIG. 14 support that when the apparatus is used, it is possible to obtain resistance test results corresponding to the actual performance of the battery cell 10 well without disassembling the battery cell 10.

Figure 15:
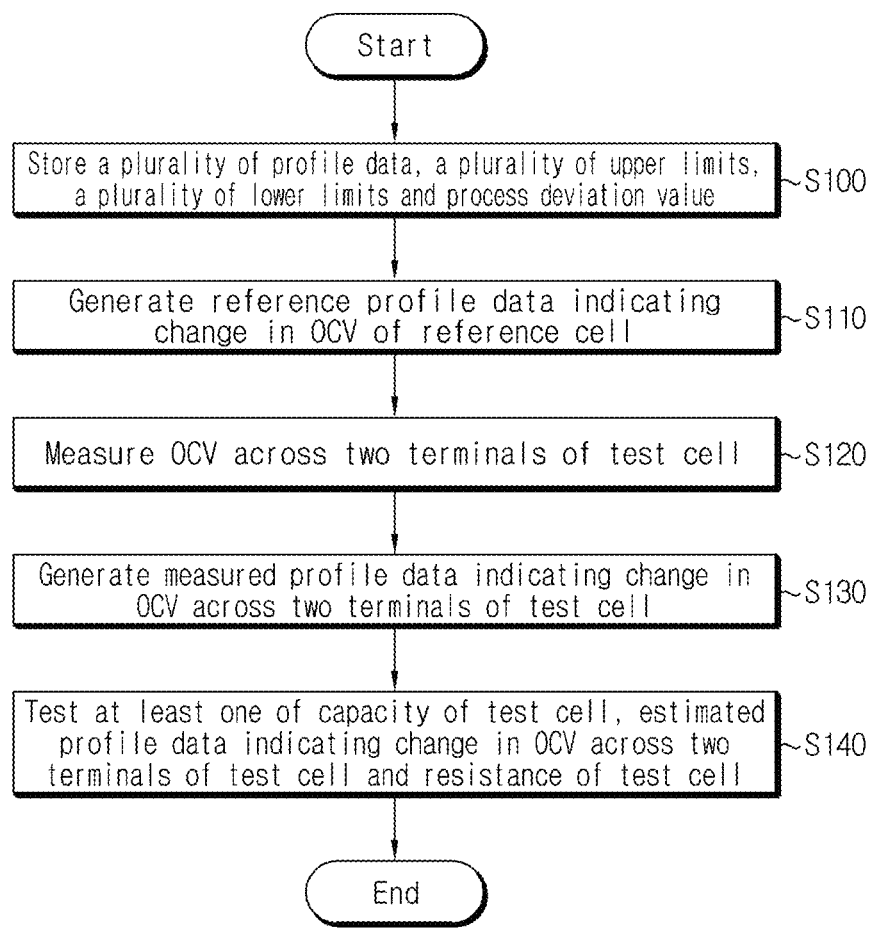
FIG. 15 is a schematic flowchart showing a method for testing the performance of a battery cell according to an embodiment of the present disclosure.

FIG. 15 is a schematic flowchart showing a method for testing the performance of a battery cell according to an embodiment of the present disclosure.

Referring to FIG. 15, in step S100, the memory unit 100 stores a plurality of profile data indicating a change in OCV of the positive electrode or the negative electrode of each of a plurality of reference cells, a plurality of upper limits corresponding to an amount of lithium ions stored in the positive electrode or the negative electrode of each of the plurality of reference cells at the upper limit of a predetermined SOC range, a plurality of lower limits corresponding to an amount of lithium ions stored in the positive electrode or the negative electrode of each of the plurality of reference cells at the lower limit of the predetermined SOC range, and a process deviation value occurred in the manufacturing process of the battery cell 10.

In step S110, the control unit 300 generates a plurality of reference profile data indicating a change in OCV of each of the plurality of reference cells in the predetermined SOC range based on the plurality of profile data, the plurality of upper limits and the plurality of lower limits.

In step S120, the measuring unit 200 measures an OCV across two terminals of the battery cell 10 with a change in SOC of the battery cell 10.

In step S130, the control unit 300 generates measured profile data indicating a change in OCV across two terminals of the battery cell 10 in the predetermined SOC range measured by the step of measuring the OCV of the battery cell 10.

Subsequently, in step S140, the control unit 300 determines at least one of the capacity of the battery cell 10, the estimated profile data indicating a change in OCV across two terminals of the battery cell 10 in the predetermined SOC range and the resistance of the battery cell 10 based on the plurality of reference profile data, the measured profile data and the process deviation value.

In the above step S140, the control unit 300 estimates an estimated positive electrode upper limit, an estimated positive electrode lower limit, an estimated negative electrode upper limit and an estimated negative electrode lower limit of the battery cell 10 based on the plurality of reference profile data and the measured profile data. The estimated positive electrode upper limit indicates an amount of lithium ions stored in the positive electrode of the battery cell 10 at the upper limit of the predetermined SOC range. The estimated positive electrode lower limit indicates an amount of lithium ions stored in the positive electrode of the battery cell 10 at the lower limit of the predetermined SOC range. The estimated negative electrode upper limit indicates an amount of lithium ions stored in the negative electrode of the battery cell 10 at the upper limit of the predetermined SOC range. The estimated negative electrode lower limit indicates an amount of lithium ions stored in the negative electrode of the battery cell 10 at the lower limit of the predetermined SOC range.

In the above step S140, the control unit 300 declares a cost function indicating the sum of the squares of residuals between the plurality of reference profile data and the measured profile data. Subsequently, the control unit 300 may determine the estimated positive electrode upper limit, the estimated positive electrode lower limit, the estimated negative electrode upper limit and the estimated negative electrode lower limit of the battery cell 10 such that a value of the cost function is minimum.

In the above step S140, the control unit 300 may calculate a positive electrode irreversible capacity, a negative electrode irreversible capacity and a negative electrode side reaction capacity of the battery cell 10 based on the plurality of profile data and the estimated positive electrode upper limit, the estimated positive electrode lower limit, the estimated negative electrode upper limit and the estimated negative electrode lower limit of the battery cell 10. The positive electrode irreversible capacity indicates an unusable capacity of the positive electrode of the battery cell 10 other than the predetermined SOC range. The negative electrode irreversible capacity indicates an unusable capacity of the negative electrode of the battery cell 10 other than the predetermined SOC range. The negative electrode side reaction capacity may indicate a side reaction capacity generated by the SEI film formed on the negative electrode surface of the battery cell 10.

In the above step S140, the control unit 300 may estimate the capacity of the battery cell 10 on the basis that a positive electrode reversible capacity corresponding to the capacity range from the estimated positive electrode lower limit to the estimated positive electrode upper limit, a negative electrode reversible capacity corresponding to the capacity range from the estimated negative electrode lower limit to the estimated negative electrode upper limit, and the capacity of the battery cell 10 are equal.

In the above step S140, the control unit 300 may estimate the capacity of the battery cell 10, the estimated profile data, and the resistance of the battery cell 10 based on the process deviation value and the negative electrode side reaction capacity.

In the above step S140, the control unit 300 may estimate the capacity of the battery cell 10 by multiplying the capacity density constant associated with the negative electrode side reaction capacity by the process deviation value.

When the control logics are implemented in software, the control unit 300 may be implemented as a set of program modules. In this instance, the program module may be stored in the memory device and executed by the processor.

There is no particular limitation on the type of control logics of the control unit 300 if at least one of control logics may be combined and the combined control logics may be written in computer-readable coding system to allow the computer to access and read. For example, the recording media includes at least one selected from the group consisting of ROM, RAM, register, CD-ROM, magnetic tape, hard disk, floppy disk and an optical data recording device. Additionally, the coding system may be stored and executed in computers connected via a network in distributed manner. Additionally, functional programs, codes and code segments for implementing the combined control logics may be readily inferred by programmers in the technical field to which the present disclosure belongs.

While the present disclosure has been hereinabove described with regard to a limited number of embodiments and drawings, the present disclosure is not limited thereto and various modifications and changes may be made thereto by those skilled in the art within the technical aspects of the present disclosure and the equivalent scope of the appended claims.

What is claimed is:

1. An apparatus for testing performance of a battery cell, comprising:
   a measuring unit electrically connected to the battery cell, the measuring unit being configured to measure an open circuit voltage (OCV) of the battery cell with a change in state of charge (SOC) of the battery cell;
   a memory unit configured to store a plurality of profile data indicating a change in OCV of a positive electrode or a negative electrode of each of a plurality of reference cells, a plurality of upper limits corresponding to an amount of lithium ions stored in the positive electrode or the negative electrode of each of the plurality of reference cells at an upper limit of a predetermined SOC range, a plurality of lower limits corresponding to an amount of lithium ions stored in the positive electrode or the negative electrode of each of the plurality of reference cells at a lower limit of the predetermined SOC range, and a process deviation value occurred in a manufacturing process of the battery cell; and
   a control unit electrically connected to the measuring unit and the memory unit, the control unit being configured to:
      generate a plurality of reference profile data indicating a change in OCV of the plurality of reference cells in the predetermined SOC range based on the plurality of profile data, the plurality of upper limits, and the plurality of lower limits;
      generate measured profile data indicating a change in OCV of the battery cell in the predetermined SOC range; and
      determine at least one of a capacity of the battery cell, an estimated profile data indicating a change in OCV of the battery cell in the predetermined SOC range, and a resistance of the battery cell based on the plurality of reference profile data, the measured profile data, and the process deviation value.

2. The apparatus according to claim 1, wherein the process deviation value includes at least one of a deviation value of an amount of positive electrode active materials per unit area, a deviation value of an amount of negative electrode active materials per unit area, a deviation value of a total positive electrode area, and a deviation value of a total negative electrode area, of the battery cell occurred in the manufacturing process of the battery cell.

3. The apparatus according to claim 1, wherein:
   the plurality of profile data includes positive electrode profile data and negative electrode profile data of each of the plurality of reference cells;
   the plurality of upper limits includes a reference positive electrode upper limit and a reference negative electrode upper limit of each of the plurality of reference cells;

the plurality of lower limits includes a reference positive electrode lower limit and a reference negative electrode lower limit of each of the plurality of reference cells;

the positive electrode profile data indicates a change in OCV of the positive electrode of the reference cell with a change in an amount of lithium ions stored in the positive electrode of the reference cell;

the negative electrode profile data indicates a change in OCV of the negative electrode of the reference cell with a change in an amount of lithium ions stored in the negative electrode of the reference cell;

the reference positive electrode upper limit indicates an amount of lithium ions stored in the positive electrode of the reference cell at the upper limit of the predetermined SOC range;

the reference negative electrode upper limit indicates an amount of lithium ions stored in the negative electrode of the reference cell at the upper limit of the predetermined SOC range;

the reference positive electrode lower limit indicates an amount of lithium ions stored in the positive electrode of the reference cell at the lower limit of the predetermined SOC range; and the reference negative electrode lower limit indicates an amount of lithium ions stored in the negative electrode of the reference cell at the lower limit of the predetermined SOC range.

4. The apparatus according to claim 2, wherein:

the control unit is configured to determine an estimated positive electrode upper limit, an estimated positive electrode lower limit, an estimated negative electrode upper limit and an estimated negative electrode lower limit of the battery cell based on the plurality of reference profile data and the measured profile data;

the estimated positive electrode upper limit indicates an amount of lithium ions stored in the positive electrode of the battery cell at the upper limit of the predetermined SOC range;

the estimated positive electrode lower limit indicates an amount of lithium ions stored in the positive electrode of the battery cell at the lower limit of the predetermined SOC range;

the estimated negative electrode upper limit indicates an amount of lithium ions stored in the negative electrode of the battery cell at the upper limit of the predetermined SOC range; and the estimated negative electrode lower limit indicates an amount of lithium ions stored in the negative electrode of the battery cell at the lower limit of the predetermined SOC range.

5. The apparatus according to claim 4, wherein the control unit is further configured to:

declare a cost function indicating a sum of squares of residuals between the plurality of reference profile data and the measured profile data; and estimate the estimated positive electrode upper limit, the estimated positive electrode lower limit, the estimated negative electrode upper limit, and the estimated negative electrode lower limit of the battery cell, such that a value of the cost function is minimum.

6. The apparatus according to claim 5, wherein:

the control unit is further configured to calculate a positive electrode irreversible capacity, a negative electrode irreversible capacity, and a negative electrode side reaction capacity of the battery cell based on the plurality of profile data, the estimated positive electrode upper limit, the estimated positive electrode lower limit, the estimated negative electrode upper limit, and the estimated negative electrode lower limit;

the positive electrode irreversible capacity indicates an unusable capacity of the positive electrode of the battery cell outside the predetermined SOC range;

the negative electrode irreversible capacity indicates an unusable capacity of the negative electrode of the battery cell outside the predetermined SOC range; and the negative electrode side reaction capacity indicates a side reaction capacity generated by a Solid Electrolyte Interface (SEI) film formed on a surface of the negative electrode of the battery cell.

7. The apparatus according to claim 6, wherein the control unit is further configured to determine the capacity of the battery cell using:

a positive electrode reversible capacity corresponding to a capacity range from the estimated positive electrode lower limit to the estimated positive electrode upper limit;

a negative electrode reversible capacity corresponding to a capacity range from the estimated negative electrode lower limit to the estimated negative electrode upper limit; and the capacity of the battery cell being equal.

8. The apparatus according to claim 6, wherein the control unit is configured to determine the capacity of the battery cell, the estimated profile data, and the resistance of the battery cell based on the process deviation value and the negative electrode side reaction capacity.

9. The apparatus according to claim 8, wherein the control unit is configured to estimate the capacity of the battery cell by multiplying a capacity density constant corresponding to the negative electrode side reaction capacity by the process deviation value.

10. A method for testing performance of a battery cell, the method comprising:

storing a plurality of profile data indicating a change in open circuit voltage (OCV) of a positive electrode or a negative electrode of each of a plurality of reference cells, a plurality of upper limits corresponding to an amount of lithium ions stored in the positive electrode or the negative electrode of each of the plurality of reference cells at an upper limit of a predetermined state of charge (SOC) range, a plurality of lower limits corresponding to an amount of lithium ions stored in the positive electrode or the negative electrode of each of the plurality of reference cells at a lower limit of the predetermined SOC range, and a process deviation value occurred in a manufacturing process of the battery cell;

generating a plurality of reference profile data indicating a change in OCV of each of the plurality of reference cells in the predetermined SOC range based on the plurality of profile data, the plurality of upper limits, and the plurality of lower limits;

measuring an OCV of the battery cell in the predetermined SOC range;

generating measured profile data indicating a change in OCV of the battery cell in the predetermined SOC range; and determining at least one of a capacity of the battery cell, an estimated profile data indicating a change in OCV of the battery cell in the predetermined SOC range, and a resistance of the battery cell based on the plurality of reference profile data, the measured profile data, and the process deviation value.

\* \* \* \* \*